(12) United States Patent
Nakajima

(10) Patent No.: US 6,730,351 B2
(45) Date of Patent: May 4, 2004

(54) METHOD AND APPARATUS FOR FORMING LIGHT ABSORPTION FILM

(75) Inventor: Yasushi Nakajima, Kanagawa-ken (JP)

(73) Assignee: Nissan Motor Co., Ltd., Kanagawa-ken (JP)

( * ) Notice: Subject to any disclaimer, the term of this patent is extended or adjusted under 35 U.S.C. 154(b) by 7 days.

(21) Appl. No.: 10/167,389

(22) Filed: Jun. 13, 2002

(65) Prior Publication Data

US 2003/0003224 A1 Jan. 2, 2003

(30) Foreign Application Priority Data

Jun. 29, 2001 (JP) ...................................... P2001-197928

(51) Int. Cl.⁷ .............................................. C23C 16/00
(52) U.S. Cl. ..................... 427/162; 427/248.1; 427/8
(58) Field of Search ............................ 427/162, 248.1, 427/8

(56) References Cited

U.S. PATENT DOCUMENTS

| | | | | |
|---|---|---|---|---|
| 4,238,525 A | * | 12/1980 | Aichert et al. | 427/597 |
| 4,959,242 A | * | 9/1990 | Itoh | 427/574 |
| 6,429,023 B1 | * | 8/2002 | Gharavi | 436/167 |

* cited by examiner

*Primary Examiner*—Bret Chen
(74) *Attorney, Agent, or Firm*—McDermott, Will & Emery

(57) ABSTRACT

A method and apparatus is provided for forming a light absorption film, composed of a porous metallic vapor deposited film with crystalline grown up in a dendrite structure, in a vacuum vapor deposition. A targeted time profile of applied electric power is obtained from electric current flowing through an evaporating boat 9 and a voltage potential thereof that enable a proper film quality to be realized with the evaporating boat using a resistive-heating technique and is preliminarily measured and stored in a computer 17 for controlling current electric power, obtained by electric current currently flowing through the evaporating boat and a voltage thereof currently appearing during a current vapor deposition process, so as to match the targeted time profile of the applied electric power. Under a condition where a desired light absorption film is obtained, since the amount of applied electric power correlated with fluctuations in an evaporating speed falls in a deviation range of approximately ±5%, a strong relationship exists between electric power applied to the evaporating boat and a quality of a resulting deposited film. Accordingly, accurately realizing an appropriately applied electric power that is preliminarily and experimentally obtained enables proper control of a vapor deposition speed, resulting in formation of a desired light absorption film in a stable and easy manner.

4 Claims, 5 Drawing Sheets

METHOD AND APPARATUS FOR FORMING LIGHT ABSORPTION FILM

BACKGROUND OF THE INVENTION

The present invention relates to a method and apparatus for forming a light absorption film onto an object and, more particularly, to a technology for vapor depositing the light absorption film onto a sensing area of a heat insulating structure such as that of a far-infrared light detector.

There have been many instances where light absorption films for use in photo-sensors are formed of metallic films each in the form of a porous crystalline structure that is grown up in a dendrite phase. In order to form such a metallic film, it has been a general practice to evacuate a vacuum chamber to a desired operating pressure and interrupt evacuating operation whereupon inactive gas is introduced into the vacuum chamber under a desired operating pressure to maintain the same at a constant pressure level. Such an operating pressure is selected to have a value of about several hundreds Pa to cause an average free stroke of reaction series to be extremely shortened. Under such an atmosphere, vapor deposition is carried out using an evaporating boat in a sequence wherein the evaporating boat is resistive-heated to a high temperature and source material composed of metal such as gold is evaporated to form a crystalline, of vapor deposited metal, grown up on a surface of an object (substrate) in a dendrite structure.

In sensors, such as thermopile type far-infrared light detectors, required for detecting a temperature as a thermal energy indicative of an extremely minute incident infrared light, as shown in FIG. 1, a far-infrared light absorption film (heat absorption film) 100 made of gold grown up in the dendrite structure is used, and a cavity 103 is formed directly beneath a sensing area 101 of a supporting substrate 102, with the cavity 103 being utilized to serve as a heat separating structure for thereby providing a remarkable increase in a sensitivity. In such a case, during a stage wherein the vapor deposition film (the far-infrared-ray light absorption film 100) is formed, since the vapor deposition film tends to absorb the infrared ray irradiated from a vapor deposition source, the vapor deposition film becomes extremely sensitive to a film forming temperature and hence a film forming condition must be controlled within a severely narrowed range. The reason for such a severe control is that in a case where the gold light absorption film is deposited over the thermally separated sensing area, the sensing area having an extremely high sensitivity is irradiated with a strong infrared light emanating from the evaporating boat to induce a remarkable increase in temperature. And, if a vapor deposition speed becomes higher than a proper level, then the light absorption film is liable to be miscible with the crystalline such as that formed in a normal film with a high film density with no formation of the dendrite structure and becomes discolored in an ocher color over an entire area. In contrast, if the vapor deposition speed is lower than the proper level, an extended vapor deposition time period is required for obtaining a desired film thickness, causing a resulting deposited film to be heated for an extended period of time. This causes the dendrite structure to be formed with the crystalline grown up in a coarse particle size and the deposited film becomes discolored over the entire area in the ocher color. Thus, the presence of the vapor deposition speed higher than or slower than the proper level causes an increase in a light reflection rate of the film surface, resulting in deterioration in the light absorption capability.

SUMMARY OF THE INVENTION

As set forth above, despite the need to execute operation under a severely controlled management, the resulting deposited film has the dendrite structure and hence a difficulty is encountered in observing to monitor the vapor deposition speed and the thickness film at site during the vapor deposition of the light absorption film. The reason for such a difficulty encountered in monitoring is described below in detail.

Methods for detecting the vapor deposition speed widely employed in vapor deposition steps include a technique for detecting a variation in an oscillating frequency of a quarts oscillating element, with a specific detection device for that purpose being commercially available in the market. To simply describe the principle, the quarts oscillating element remains located in the vicinity of the resulting deposited film. When the operation for vapor deposition is implemented, a vapor deposition film is formed over the quarts oscillating element. The quarts oscillating element oscillates at a resonant frequency that decreases in dependence on a mass of the deposited film, with the variation in the resonant frequency being converted into a corresponding thickness of the vapor deposited film to be monitored. However, since the vapor deposited film formed in a dendrite crystalline has a soft structure, the presence of the vapor deposited film formed on the quarts oscillating element causes the mass of the entire film to be hard to contribute to vibration of the oscillating element. For this reason, there is no correlation between the mass of vapor deposited film and the resonant frequency of the quarts oscillating element, resulting in a difficulty in monitoring a status of vapor deposition.

Further, during the vapor deposition process, a speed control can be theoretically possible by controlling the temperature of the vapor deposition boat. When this takes place, the evaporating boat becomes excessively high temperature and, so, the evaporating boat is made of metal with a high melting point such as tungsten or molybdenum. In this instance, it is extremely hard to carry out the measurement, through the use of a thermocouple without consuming the same, in a stable manner at all times.

In addition, while another expedient can conceivably include a technique for monitoring the operating temperature through the use of a radiation thermometer, a mixture of vaporized source material and inactive gas filled in the vacuum chamber circulates therein by convection during the vapor deposition process, causing the light absorption film to be deposited onto a measurement window of the radiation thermometer with a difficulty encountered in stably measuring the operating temperature.

The evaporating boat forms the reaction series wherein the resistance value of the evaporating boat varies every moment depending on the operating temperature and the amount of molten source material fluctuates in an unstable fashion, resulting in an inability of directly controlling the vapor deposition speed for the reasons set forth above. To address such an issue, a state-of-the-art solution includes a method for manually adjusting electric current flowing through the vapor deposition boat with perception and experience of an operator while observing a status of source material remaining on the vapor deposition boat and a status of vapor of a vaporized product in a peripheral area of the source material to determine conditions under which the vapor deposition process is carried out. For this reason, it was extremely difficult to stably control and realize a desired film forming condition.

The present invention has been completed to address the above identified issues encountered in the state-of-the-art, and it is an object of the present invention to provide a method and apparatus for forming a light absorption film to realize a desired film forming condition in a stable and easy manner.

The inventors of the present patent application has uncovered a fact that the applied electric power correlated with the variation in the vapor deposition speed has a value in a deviation range of approximately ±5% under a condition to enable a desired film colored in from black and brown to black colors to be obtained when forming the far-infrared light absorption film.

With the above view in mind, according to an aspect of the present invention, there is provided a method for forming a light absorption film, composed of a porous metallic vapor deposited film with crystalline grown up in a dendrite structure, in a vacuum vapor deposition, comprising: preliminarily measuring and storing a time profile of targeted electric power in a storage unit by preliminarily applying the electric power to an evaporating boat to perform resistive-heating to measure electric current, flowing through the evaporating boat, and a voltage potential, appearing at both sides of the evaporating boat, that enable a proper film quality to be realized; and controlling current electric power, that is a product of the electric current currently flowing through the evaporating boat and the voltage potential currently appearing at the both sides of the evaporating boat during a current vapor deposition, so as to match the time profile of the targeted electric power stored in the storage unit.

With such a structure, the electric power to be applied is precisely controlled for properly controlling the vapor deposition speed, thereby enabling the desired light absorption film to be obtained at all times.

According to another aspect of the present invention, there is provided a method for forming a light absorption film, composed of a porous metallic deposited film with crystalline grown up in a dendrite structure, in a vacuum vapor deposition, comprising: preliminarily measuring and storing a targeted time changing rate of a combined resistance, in a storage unit, between an evaporating boat and source material obtained by preliminarily applying electric power to the evaporating boat to perform resistive-heating to measure electric current, flowing through the same, and a voltage potential, appearing at both sides of the evaporating boat, that enable a proper film quality to be realized; and controlling electric power to be applied to the evaporating boat such that a current time changing rate of the combined resistance obtained by the electric current currently flowing through the evaporating boat and the voltage potential currently appearing at the both sides of the evaporating boat during a current vapor deposition matches the targeted time changing rate of the combined resistance stored in the storage unit.

According to another aspect of the present invention, there is provided a light absorption film forming apparatus, comprising: a vacuum vapor deposition device having an evaporating boat to perform resistive-heating; a storage unit storing a time profile of targeted electric power obtained by measuring electric current flowing through the evaporating boat and a voltage potential appearing at both sides of the same that enable a proper film quality to be realized; and a control unit controlling current electric power to be applied to the evaporating boat such that the current electric power obtained by a product of the electric current currently flowing through the evaporating boat and the voltage potential currently appearing at the both sides of the same during a current vapor deposition matches the targeted time profile of the applied electric power stored in the storage unit.

According to a further aspect of the present invention, there is provided a light absorption film forming apparatus, comprising: vacuum vapor deposition means having an evaporating boat to perform resistive-heating; storage means for storing a time profile of targeted electric power obtained by measuring electric current flowing through the evaporating boat and a voltage potential appearing at both sides of the same that enable a proper film quality to be realized; and control means for controlling current electric power to be applied to the evaporating boat such that the current electric power obtained by a product of the electric current currently flowing through the evaporating boat and the voltage potential currently appearing at the both sides of the same during a current vapor deposition matches the time profile of the targeted electric power stored in the storage unit.

According to a further aspect of the present invention, there is provided a light absorption film forming apparatus, comprising: a vacuum vapor deposition device having an evaporating boat to perform resistive-heating; a storage unit storing a targeted time changing rate of a combined resistance between the evaporating boat and source material obtained by preliminarily applying electric power to the evaporating boat to perform resistive-heating to measure electric current, flowing through the same, and a voltage potential, appearing at both sides of the evaporating boat, that enable a proper film quality to be realized; and a control unit controlling electric power to be applied to the evaporating boat such that a current time changing rate of the combined resistance obtained by the electric current currently flowing through the evaporating boat and the voltage potential currently appearing at the both sides of the evaporating boat during a current vapor deposition matches the targeted time changing rate of the combined resistance stored in the storage unit.

According to a still further aspect of the present invention, there is provided a light absorption film forming apparatus, comprising: vacuum vapor deposition means having an evaporating boat to perform resistive-heating; storage means for storing a targeted time changing rate of a combined resistance between the evaporating boat and source material obtained by preliminarily applying electric power to the evaporating boat to perform resistive-heating to measure electric current, flowing through the same, and a voltage potential, appearing at both sides of the evaporating boat, that enable a proper film quality to be realized; and control means for controlling electric power to be applied to the evaporating boat such that a current time changing rate of the combined resistance obtained by the electric current currently flowing through the evaporating boat and the voltage potential currently appearing at the both sides of the evaporating boat during a current vapor deposition matches the targeted time changing rate of the combined resistance stored in the storage means.

DETAILED DESCRIPTION OF THE PREFERRED EMBODIMENTS

To describe the present invention more in detail, a light absorption film forming apparatus of a preferred embodiment according to the present invention to carry out a method of the present invention will be described below in connection with FIGS. 2 and 3.

Figure 2:
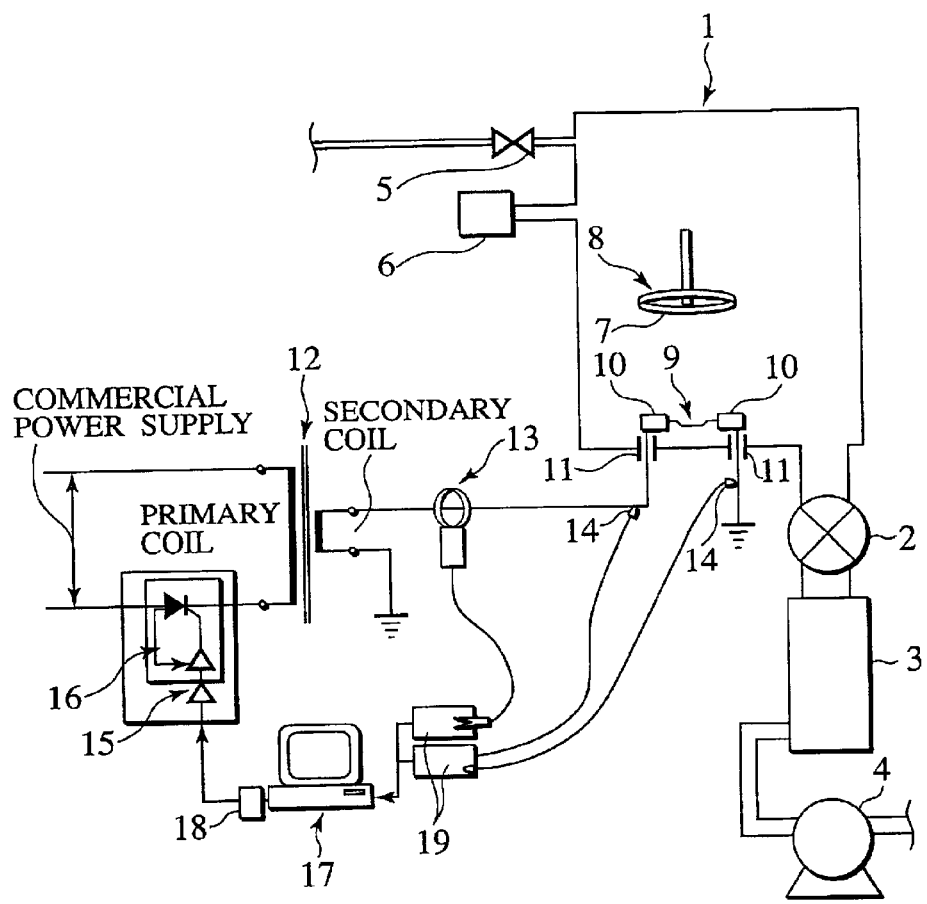
FIG. 2 is an overall structural view of a light absorption film forming apparatus of a preferred embodiment according to the present invention to carry out a method of the present invention.
Figure 3:
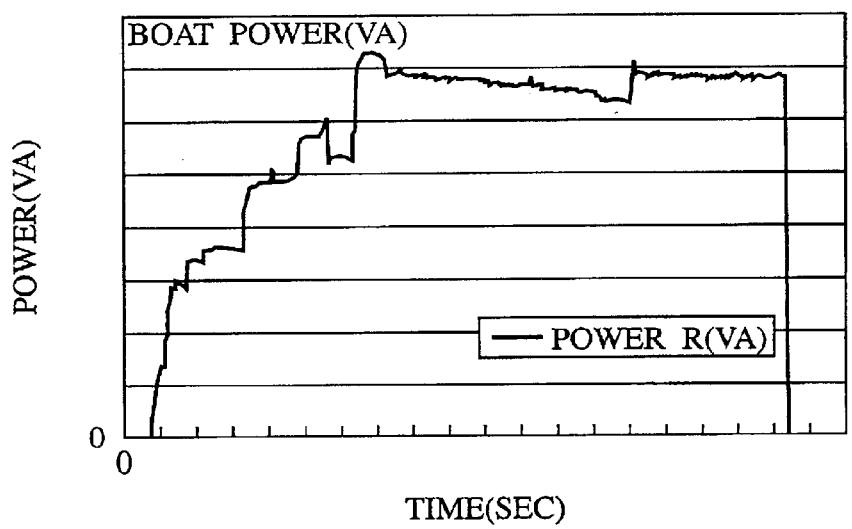
FIG. 3 is a graph illustrating an example of a time profile of electric power to be applied when a light absorption film with a desired film quality is formed.

FIG. 2 shows an overall structural view of the light absorption film forming apparatus of the preferred embodiment to form a light absorption film using the forming method of the present invention.

In FIG. 2, the light absorption film forming apparatus is shown as including a vacuum chamber 1 which is connected through a main valve 2 to a high vacuum pump 3 and a main suction pump 4 and which is also connected to a nitrogen gas supply pipe via a shut off valve 5, with a vacuum meter 6 being in fluid communication with the vacuum chamber 1 to measure pressure inside the same. Located in the vicinity of a center of the vacuum chamber 1 is a holder 8 by which a sample 7 is fixedly supported such that one surface is directed downward to be formed with a light absorption film. Disposed beneath the sample 7 is a self-resistive-heated evaporating (vapor deposition) boat 9 for evaporating metal to be vapor deposited onto an object.

Both terminal ends of the evaporating boat 9 are electrically connected to fixed terminals 10, 10, one of which is connected through a hermetically sealed current terminal 11 to a step-down transformer 12 and the other one of which is grounded as shown. When in design, electrical resistances of the fixed terminals 10, 10, the step-down transformer 12 and associated electric wirings are selected to be sufficiently smaller than that of the evaporating boat 9. A cramp sensor 13 is coupled to the electrical wiring for measuring electric current, and both ends of the evaporating boat 9 are provided with test points 14 for measuring voltage potential. Connected to an input of the step-down transformer 12 is a commercial alternating power supply of 200 V, of which electrical connection is interrupted with a semiconductor relay 16 controlled with an electric power controller 15. Further, an output voltage of the clamp sensor 13 and the voltage potential between the test points 14 are measured with alternating voltage meters 19, 19, respectively, with output data being delivered to a computer 17.

The computer 17 is responsive to these inputs to provide computed data to a D/A converter 18 which outputs an analogue signal varying in a range of from 1 to 5 V to be applied as a control signal to the electric power controller 15.

Experiments conducted by the inventors of the present patent application have revealed that applied electric power, obtained by the product of the electric current value obtained from the cramp sensor 13 and the voltage potential appearing between the test points during a vapor deposition process when a desired film quality is obtained, remains in a deviation range of approximately ±5%. A targeted time profile of the applied electric power (i.e. a targeted time profile), that enables the light absorption film with the desired film quality to be obtained, is preliminarily measured and resulting data is preliminarily stored in a storage unit of the computer 17. FIG. 3 shows a characteristic curve illustrating an example of the targeted time profile set forth above, with the abscissa axis indicating time whereas the axis of ordinates indicates the amount of applied electric power.

Now, a control method to be carried out during the vapor deposition process is described below in detail.

Figure 1:
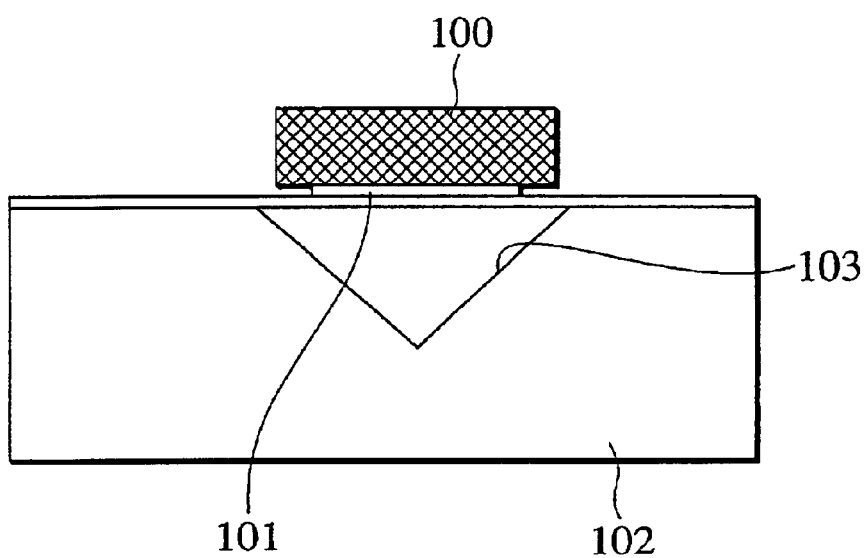
FIG. 1 is a sectional view illustrating an example of a thermopile type far-infrared ray detector.

When forming a black colored Au film (alias a "black curtain") in the form of a dendrite phase onto the heat insulation structure shown in FIG. 1, the sample 7 is set at a desired position in the vacuum chamber 1 in a manner as shown in FIG. 2, and gold of about 1 gram is placed as source material (vapor deposition material) on the evaporating boat 9. Then, the vacuum chamber 1 is evacuated with the evacuating device to a desired operating pressure whereupon the main valve 2 is closed while opening the shut off valve 5 to allow nitrogen gas to be introduced until the operating pressure in the vacuum chamber 1 is developed at 200 Pa and, thereafter, the shut off valve 5 is closed to render nitrogen gas to be sealed within the vacuum chamber 1. Subsequently, the evaporating boat 9 is applied with electric current according to the targeted time profile of the applied electric power shown in FIG. 3. When this takes place, the value of electric current flowing through the evaporating boat 9 is detected with the cramp sensor 13 and read out by the alternating voltage meter 19, with detected current data being outputted to the in computer 17. Likewise, the voltage potential appearing at both ends of the evaporating boat 9 is read out from the test points 14, 14 with the alternating voltage meter 19, with detected voltage data being outputted to the computer 17. Since, in this instance, detected current data of the clamp sensor 13 is liable to be contaminated with large noises due to deviation in detection current, alternating voltage measurement may be conducted using a voltage meter to implement measurement using a technique that is called as "a measurement of true root mean square value".

The computer 17 converts the above noted two kinds of detected data into electric current and voltage, respectively, in a sequential fashion to obtain the product of these components, thereby enabling current electric power applied to the evaporating boat 9 to be obtained. A resulting current electric power value is compared with the targeted time profile of the electric power value stored in the storage unit and outputs a control signal so as to minimize an error between the two electric power values.

There is a specific reason why, during such control, current electric power to be applied to the evaporating boat 9 is adjusted so as to be in coincident with the targeted electric power of the time profile that is preliminarily stored. That is, since the evaporating boat 9 has a resistance value that widely varies because of ambient temperature and the amount of residue of source material, and since the evaporating boat 9 is applied with large electric current with a low voltage, there are many instances where a difficulty is encountered in controlling such a large electric current per se and hence the step-down transformer 12 is employed to vary the output voltage in a range of from a higher level to a lower level to address the above issue. Because of use of such component part, since there exists a nonlinear region composed of inductance components between a controlled output and a status on the evaporating boat 9, the status per se of the evaporating boat 9 must be measured at all times.

When trying to directly control such a large electric current, there is a need for preparing a variable voltage and variable current electric power supply that supplies large electric current with a low voltage, resulting in a need for a large-scale circuitry in an increased cost. Also, the electric power may be controlled using an inverter.

According to the method of the present invention, as set forth above, controlling current electric power so as to accurately reproduce the time profile of targeted electric power that has been experimentally obtained enables a vapor deposition speed to be properly controlled, thereby compelling a desired film forming condition to be established in a stable and easy manner to enable formation of a desired light absorption film at all times.

Further, although the resistance value of the evaporating boat 9 momentarily varies due to the ambient temperature and evaporative consumption of body material per se and also due to the amount of residues of source material on the evaporating boat 9, properly controlling current electric power to be applied to source material enables an optimum vapor depositing condition to be established. Thus, not only the state-of-the-art issue that should rely on the individual perception of the operator can be solved with free from conditional fluctuations in the vapor depositing series but also heavy work load required for the operator can be mitigated.

Next, a termination step for the vapor deposition process is described below.

Figure 6:
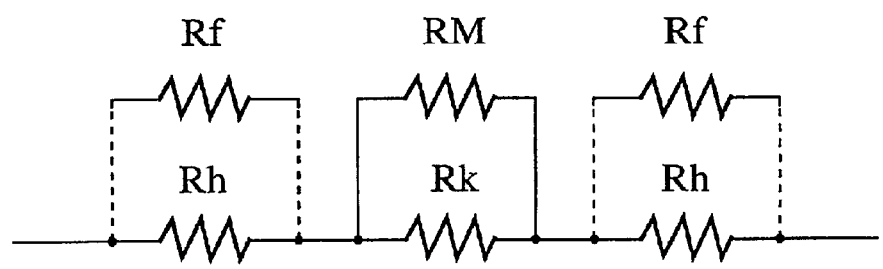
FIG. 6 is a schematic equivalent circuit diagram illustrating the combined resistance between electrical resistance of a simple of the vapor deposition boat and electrical resistance of vapor deposition (source) material.

When performing the operation to evaporate source material of gold from the evaporating boat 9, electric current is applied through both the simple of the evaporating boat 9 and source material thereon to produce heat in the evaporating boat 9. Under such a condition, as shown in FIG. 6, the electrical resistance on the evaporating boat 9 includes a combined resistance R between electrical resistance (Rh+Rk+Rh) of the simple of the evaporating boat 9 and electrical resistance (RM) of source material as expressed in a formula:

$$R=Rh+1/\{(1/Rk)+(1/RM)\}+Rh$$

where the resistance value to be obtained from the voltage and electric current represents the combined resistance between the evaporating boat 9 and source material of gold remaining in a molten state thereon. Also, a reference symbol RF of FIG. 6 is described below in detail.

On the evaporating boat 9, as vaporization of source material proceeds, contribution of source material to the combined resistance decreases and the combined resistance comes closer to the electrical resistance (Rh+Rk+Rh) of the simple of the evaporating boat 9 until evaporation of gold is terminated and, simultaneously, the combined electric resistance coincides with the electrical resistance of the simple of the evaporating boat 9. Thus, preliminarily measuring the varying characteristic of electric power and electrical resistance appearing when electric power is applied only to the evaporating boat 9 and storing the varying characteristic provides a capability of discriminating a terminated stage of evaporation of source material on the evaporating boat 9 when the electrical resistance obtained from the electric current and voltage applied to the evaporating boat 9 during the vapor deposition process is brought into coincidence with the electrical resistance of the simple of the vapor deposition boat with the same amount of electric power applied thereto, thereby enabling the supply of electric power to the evaporating boat 9 to be properly terminated. With such a technique, it is possible to automatically preclude the sample from being excessively heated up to a higher temperature than required.

Though it is undesirable to continuously heat the vapor deposition boat after the evaporation of source material has been terminated in light of deterioration in the light absorption rate, the control set forth above enables the termination of evaporation of source material to be automatically discriminated for thereby interrupting a further evaporating operation.

With the light absorption film forming apparatus shown in FIG. 2, further, the absence of need for observing the status on the evaporating boat 9 in the vacuum chamber 1 via an inspection hole enables a remote operation to be carried out with no need for cleaning the inspection hole, resulting in a significant reduction in the number of steps in load work.

Now, a method of a second preferred embodiment is described below in detail.

Although vapor deposition is carried out in the second preferred embodiment using the light absorption film forming apparatus with the same structure as that of the first preferred embodiment, vapor depositing speed is not controlled in dependence on the targeted time profile of the applied electric power but is controlled using a technology of estimating an evaporating speed of source material from variations in the electrical resistance value of the vapor deposition boat.

Figure 4:
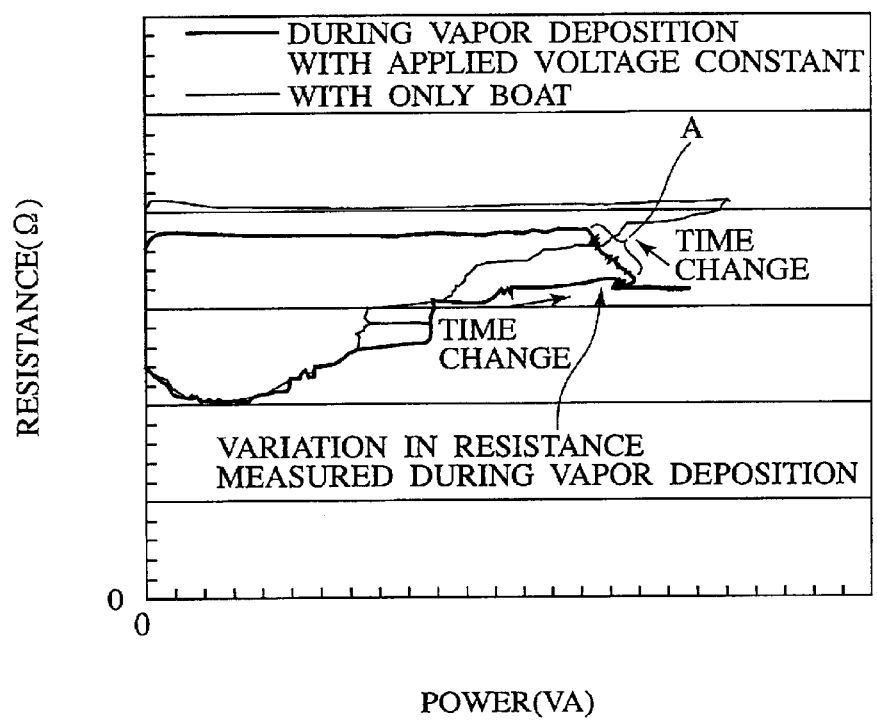
FIG. 4 is a graph illustrating variations in combined resistance of a vapor deposition boat, with the applied electric power remaining constant, plotted in terms of the applied electric power.

FIG. 4 shows a graph illustrating an example of variations in a combined resistance of the evaporating boat 9 plotted in terms of electric power applied to the evaporating boat 9, with the applied voltage remaining constant. In the graph of FIG. 4, an area A indicates a region representative of variations in electric resistance during the vapor deposition process and is expressed in a negative coefficient with respect to electric power when controlling the presently filed preferred embodiment with the voltage applied to the evaporating boat 9 remaining constant. In general, the temperature coefficients of the electrical resistance values of metals such as tungsten or molybdenum to be used for the vapor deposition boat, or gold to be used as source material have positive coefficients. That is, the lower the temperature, the lower will be the resistance value. However, as set forth above, the electrical resistance of source material on the evaporating boat decreases as source material on the evaporating boat evaporates due to reduction in the contribution of source material and hence the combined resistance increases. With such a control with the fixed voltage as attained in the presently filed preferred embodiment, although an increase in the electrical resistance leads to a reduction in electric current to decrease electric power to be supplied to the evaporating boat 9 whereby the temperature of the evaporating boat 9 decreases, in spite of such situations, the resistance value increases. Thus, it appears that the measured increase in the electrical resistance is derived from the decrease in source material. Accordingly, observing an increasing speed of the electrical resistance enables the detection of an evaporating speed of source material. As a consequence, preliminarily measuring the time changing rate of the combined resistance between the evaporating boat and source material through measurement of electric current flowing through the evaporating boat 9 and the voltage appearing at the both ends thereof that enable the appropriate film quality to be realized and storing preliminarily measured time changing rate of the combined resistance as a targeted time changing rate of the combined resistance in the storage unit enables control of current electric power such that the value of current time changing rate of the combined resistance obtained from the electric current currently flowing through the evaporating boat 9 and the voltage currently appearing at the both ends thereof is brought into coincidence with the targeted time changing rate of the combined resistance stored in the above storage unit. This results in a capability of easily forming a desired light absorption film at all times.

As set forth above, if the evaporation speed remains constant regardless of the amount of residue of source material remaining on the vapor deposition boat, the variation rate of the resistance value remain constant and, therefore, it is possible for the evaporation speed to be easily controlled when followed with the variation rate of the combined resistance as attained in the presently filed preferred embodiment. Consequently, structuring the vapor deposition apparatus to permit the self-supply of source material and the evaporating operation to be repeatedly executed so as to cause the evaporating boat to be wet with source material at all times precludes an unstable evaporating condition of source material that would otherwise occur when an entire surface of the maximum heating area of the evaporating boat is not wet with source material, resulting in an improved controllability in an automatic operation of the vapor deposition process. Also, the presence of a technology of following the variation in the resistance value allows a constant-power control to be employed instead of the constant-voltage control as employed in the example set forth above.

Now, a deposition boat of a preferred embodiment to be employed in the present invention is discussed below in detail with reference to FIG. 5.

The vapor deposition boat of the preferred embodiment is capable of contributing to a stability of an entire operation in the vapor deposition process in a general practice and provides a remarkable advantageous effect especially in a case where a difficult control is encountered as in the present invention.

Figure 5:
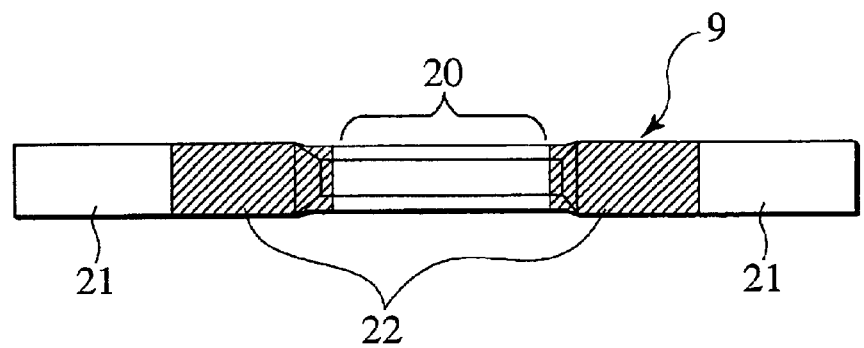
FIG. 5 is a structural view of an example of the vapor deposition boat of a resistive-heating type to be used in the method of the present invention.

As shown in FIG. 5, the evaporating boat 9 of the preferred embodiment includes a central scorching heat area 20 formed at a circumferentially periphery of a central portion that forms a heating area of the evaporating boat 9, a non-wetting area 22 formed around the scorching heat area 20 and subjected to a surface treatment to preclude source material and the evaporating boat material from being wet with respect to one another, and electrical connector portions 21, 21 extending outward from the non-wetting area 22 for connection with electrodes through which electric current is supplied.

The reason for the above structure of the vapor deposition boat is described below in detail.

The speed $\tilde{A}$(molecule/second) of evaporation at a vacuum theory is expressed by the following formula:

$$\tilde{A} = 2.63 \times 10^{24} \times PA/(MT)^{1/2}$$

where P: evaporation pressure

A: surface area of the evaporating region

M: molecular weight

T: temperature.

Also, it is to be noted that the above formula is described for example in "Vacuum Technical Manual" written by John F. Ohanron, on page 112, published by Sangyotosho.

Since the evaporation pressure (P) is an intrinsic value that is determined with the temperature (T) of the [molecular weight (M)] of source material, the evaporation speed $\tilde{A}$ is determined with the temperature of the evaporating region and the surface area. Here, it is to be appreciated that the temperature of the evaporating region of the evaporating boat 9 can be controlled with the supplied electric power and the surface area of the evaporating region is the surface area of the scorching heat area 20 shown in FIG. 5 whereby the evaporating speed $\tilde{A}$ can be controlled with the supplied electric power.

Besides, on the evaporating boat 9 in an actual practice, source material begins to evaporate on the scorching heat area 20 in the vicinity of a central portion thereof remaining at the highest temperature, with other area of the evaporating boat 9 remaining at a lower temperature due to heat radiated to the fixed terminals 10, 10. When this occurs, source material widened due to the wetting phenomenon between the evaporating boat 9 and source material, and source material deposited again onto the evaporating boat 9 during the vapor deposition process remaining in non-evaporated state. Such residual source material is expressed by the resistor Rf, in FIG. 6, that is connected in parallel with the resistor Rh to decrease an apparent resistance of the evaporating boat 9 while increasing the heat conductivity related to the fixed terminals 10, 10 such that the amount of electric power contributed to evaporation of source material remaining on the evaporating boat 9 is lowered. Thus, the present invention concerns a capability of utilizing electric power for varying the condition of the vapor deposition control.

With the vapor deposition boat of the presently filed preferred embodiment, the non-wetting area 22 may be processed with a carbide treatment to have a non-wetting property, thereby precluding source material from crawling up toward the fixed terminals 10, 10 due to the wetting property of source material while compelling the surface area of the evaporating portion to remain constant. Accordingly, this enables source material to be continuously fed to a bare surface of the central scorching area 20, which is not processed with the non-wetting treatment, of the evaporating boat 9 with no short of source material, and electric power to be supplied is controlled, thereby providing a capability of controlling the vapor deposition speed in a stable condition at all times.

Further, the surface of the above described vapor deposition boat may be preferably formed with the carbide layer with its thickness limited to an extent to preclude an adverse affect in the increase in the resistance value of the vapor deposition boat. Furthermore, if the contacted areas between the electrical connector portions 21, 21 and the respective associated electrodes are subjected to the carbide treatment, those contact areas have increased contact resistances to provide a cause of heat generation and so such carbide treatment should be avoided. Moreover, the non-wetting treatment technique may include, in addition to the carbide treatment, a technique for vapor depositing carbon.

Further, it is to be appreciated that various views of the drawings discussed above are shown under deformation to provide an ease of illustration and there are some areas which have no accurate dimension rate. Furthermore, numeric values of the preferred embodiments are used only for explanation purposes. Thus, the present invention is not limited thereto and may of course be altered to meet various external conditions.

From the foregoing description, it will be understood that, according to the method and apparatus of the present invention, the time profile, that is experimentally obtained, of appropriate electric power to be applied is precisely realized for properly controlling the vapor deposition speed to realize the desired film forming condition in a stable and easy manner whereby it is possible to form the desired light absorption film at all times.

The entire content of Japanese Patent Application No. P2001-197928 with a filing data of Jun. 29, 2001 is herein incorporated by reference.

Although the present invention has been described above by reference to certain embodiment, the invention is not limited to the embodiment described above and modifications will occur to those skilled in the art, in light of the teachings. The scope of the invention is defined with reference to the following claims.

What is claimed is:

1. A method for forming a light absorption film, composed of a porous metallic vapor deposited film with crystalline grown up in a dendrite structure, in a vacuum vapor deposition, comprising:

preliminarily measuring and storing a time profile of targeted electric power in a storage unit by preliminarily applying the targeted electric power to a resistive-heated evaporating boat to measure electric current, flowing through the evaporating boat, and a voltage potential, appearing at both sides of the evaporating boat, that enable a proper film quality to be realized; and controlling current electric power, that is a product of the electric current currently flowing through the evaporating boat and the voltage potential currently appearing at the both sides of the evaporating boat during a current vapor deposition, so as to match the targeted electric power stored in the storage unit.

2. The method according to claim 1, further comprising:

preliminarily obtaining and storing relational data in the storage unit between the electric power applied to the evaporating boat and an electrical resistance value thereof in the absence of source material on the evaporating boat; and terminating vapor deposition when an electrical resistance value appearing during the vapor deposition carried out with the applied electric power matches the electrical resistance value stored in the storage unit.

3. A method for forming a light absorption film, composed of a porous metallic deposited film with crystalline grown up in a dendrite structure, in a vacuum vapor deposition, comprising:

preliminarily measuring and storing a targeted time changing rate of a combined resistance, in a storage unit, between an evaporating boat and source material obtained by preliminarily applying electric power to the evaporating boat to perform resistive-heating to measure electric current, flowing through the same, and a voltage potential, appearing at both sides of the evaporating boat, that enable a proper film quality to be realized; and controlling electric power to be applied to the evaporating boat such that a current time changing rate of combined resistance obtained by the electric current currently flowing through the evaporating boat and the voltage potential currently appearing at the both sides of the evaporating boat during a current vapor deposition matches the targeted time changing rate of the combined resistance stored in the storage unit.

4. The method according to claim 3, further comprising:

preliminarily obtaining and storing relational data in the storage unit between the electric power applied to the evaporating boat and an electrical resistance value thereof in the absence of source material on the evaporating boat; and terminating vapor deposition when an electrical resistance value appearing during the vapor deposition carried out with the applied electric power matches the electrical resistance value stored in the storage unit.

* * * * *